United States Patent
Ishida et al.

(10) Patent No.: US 8,140,290 B2
(45) Date of Patent: Mar. 20, 2012

(54) TRANSMISSION CHARACTERISTICS MEASUREMENT APPARATUS, TRANSMISSION CHARACTERISTICS MEASUREMENT METHOD, AND ELECTRONIC DEVICE

(75) Inventors: Masahiro Ishida, Gunma (JP); Kenichi Nagatani, Gunma (JP)

(73) Assignee: Advantest Corporation, Tokyo (JP)

( * ) Notice: Subject to any disclaimer, the term of this patent is extended or adjusted under 35 U.S.C. 154(b) by 488 days.

(21) Appl. No.: 12/413,604

(22) Filed: Mar. 30, 2009

(65) Prior Publication Data

US 2010/0244881 A1    Sep. 30, 2010

(51) Int. Cl.
*G01D 21/00* (2006.01)
*G01R 29/00* (2006.01)
*G06F 19/00* (2011.01)
*G06F 17/40* (2006.01)

(52) U.S. Cl. ........ 702/109; 73/1.01; 73/865.9; 702/107; 702/124; 702/187

(58) Field of Classification Search ............... 73/1.01, 73/432.1, 865.9, 866.1; 702/1, 33, 57, 58, 702/85, 107, 108, 109, 110, 111, 112, 117, 702/124, 17, 182, 187, 189, 127

See application file for complete search history.

(56) References Cited

U.S. PATENT DOCUMENTS

| | | | | |
|---|---|---|---|---|
| 2,902,644 A * | 9/1959 | McDonald | ................... | 324/615 |
| 3,055,588 A * | 9/1962 | Ratz | ............................... | 702/109 |
| 3,082,374 A * | 3/1963 | Buuck | .......................... | 324/73.1 |
| 3,393,301 A * | 7/1968 | Valstar | .......................... | 702/109 |
| 3,526,761 A * | 9/1970 | Smith | .......................... | 702/109 |
| 6,405,147 B1 * | 6/2002 | Fera | ............................. | 702/112 |

FOREIGN PATENT DOCUMENTS

JP    2010-246108 A    * 10/2010

* cited by examiner

*Primary Examiner* — Edward Cosimano
(74) *Attorney, Agent, or Firm* — Jianq Chyun IP Office

(57) ABSTRACT

Provided is a transfer characteristic measurement apparatus that measures a transfer characteristic of a circuit under test between input and output, comprising a test signal input section that generates a test signal by adding together a carrier signal having a prescribed frequency and an additional signal having a frequency that differs from the prescribed frequency, and inputs the test signal to the circuit under test; and a transfer characteristic measuring section that measures the transfer characteristic of the circuit under test at the frequency of the additional signal based on a result from a measurement of an output signal output by the circuit under test. The circuit under test may be formed on a semiconductor chip. The circuit under test may correct a signal input to the semiconductor chip, and outputs the corrected signal. The semiconductor chip may further include a sampling circuit that samples the output signal of the circuit under test at the frequency of the carrier signal.

11 Claims, 15 Drawing Sheets

TRANSMISSION CHARACTERISTICS MEASUREMENT APPARATUS, TRANSMISSION CHARACTERISTICS MEASUREMENT METHOD, AND ELECTRONIC DEVICE

BACKGROUND

1. Technical Field

The present invention relates to a transfer characteristic measurement apparatus, a transfer characteristic measurement method, and an electronic device.

2. Related Art

In high-speed serial communication, the quality of a communicated signal decays because of restrictions in frequency bandwidth or the like in the signal transmission path. When compensating for this decay, an equalizer is used to generate an output signal by adjusting the amplitude and phase of an input signal according to the frequency. The characteristics of the equalizer are evaluated after a measurement instrument such as an oscilloscope measures the waveform of the output signal from the equalizer. Recently, high-speed serial communication devices have begun including these equalizers, which makes it difficult to evaluate the equalizer by directly measuring the waveform of the signal output by the equalizer.

SUMMARY

Therefore, it is an object of an aspect of the innovations herein to provide a transfer characteristic measurement apparatus, a transfer characteristic measurement method, and an electronic device, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary transfer characteristic measurement apparatus may include a transfer characteristic measurement apparatus that measures a transfer characteristic of a circuit under test between input and output, comprising a test signal input section that generates a test signal by adding together a carrier signal having a prescribed frequency and an additional signal having a frequency that differs from the prescribed frequency, and inputs the test signal to the circuit under test; and a transfer characteristic measuring section that measures the transfer characteristic of the circuit under test at the frequency of the additional signal based on a result from a measurement of an output signal output by the circuit under test.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
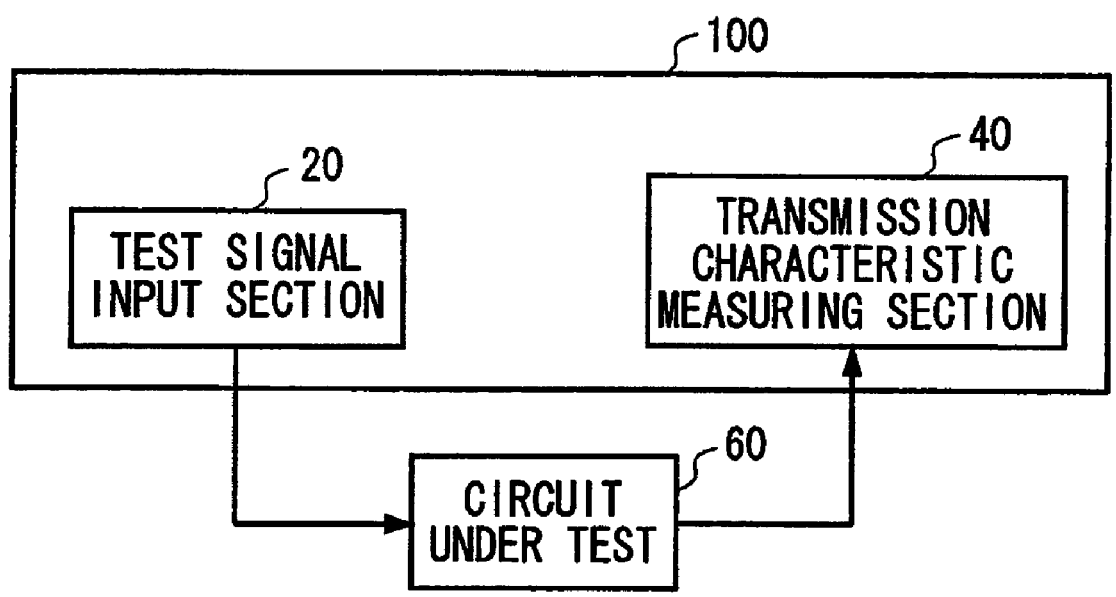
FIG. 1 shows a configuration of a transfer characteristic measurement apparatus 100 according to a first embodiment of the present invention.

FIG. 1 shows a configuration of a transfer characteristic measurement apparatus 100 according to a first embodiment of the present invention. The transfer characteristic measurement apparatus 100 measures a transfer characteristic of a circuit under test 60 between input and output. The circuit under test 60 may be an equalizer. The transfer characteristic measurement apparatus 100 measures a gain characteristic or a phase characteristic of the circuit under test 60 at each frequency of a signal input to the circuit under test 60.

The transfer characteristic measurement apparatus 100 is provided with a test signal input section 20 and a transfer characteristic measuring section 40. The test signal input section 20 generates a test signal by adding together a carrier signal having a prescribed frequency and an additional signal having a frequency different from the prescribed frequency, and inputs the test signal to the circuit under test 60. The transfer characteristic measuring section 40 measures the transfer characteristic of the circuit under test 60 at the frequency of the additional signal, based on a measurement result of the output signal from the circuit under test 60.

More specifically, the test signal input section 20 changes the ratio of the amplitude of the additional signal to the amplitude of the carrier signal input to the circuit under test 60. The transfer characteristic measuring section 40 measures the characteristic of the signal output by the circuit under test 60, for each amplitude of the additional signal. The transfer characteristic measurement apparatus 100 may measure the gain characteristic of the circuit under test 60 based on the measurement result and the ratio of the additional signal amplitude to the carrier signal amplitude.

The transfer characteristic measuring section 40 may measure the bit error of the signal output by the circuit under test 60. When the ratio of the amplitude of the additional signal component to the amplitude of the carrier signal component in the signal output by the circuit under test 60 exceeds a prescribed value, the eye of the carrier signal closes, which causes bit errors to begin occurring. The transfer characteristic measuring section 40 may calculate the gain of the circuit under test 60 at the frequency of the additional signal based on the amplitude of the additional signal at which bit errors begin occurring in the signal output by the circuit under test 60.

The carrier signal may be a clock pattern signal with a bit rate corresponding to a prescribed frequency, or may be a data pattern signal having an irregular bit sequence. The carrier signal may have a waveform that is a square wave or a sinusoidal wave.

The test signal input section 20 may change the phase difference of the additional signal relative to the phase of the carrier signal input to the circuit under test 60. The transfer characteristic measuring section 40 measures the characteristic of the signal output by the circuit under test 60 at each phase difference of the additional signal. The transfer characteristic measurement apparatus 100 may measure the phase characteristic of the circuit under test 60 based on the measurement result and the phase difference of the additional signal relative to the phase of the carrier signal. The method for measuring the phase characteristic will be described below.

As described above, the transfer characteristic measurement apparatus 100 according to the present embodiment can measure the gain characteristic and the phase characteristic of the circuit under test 60 by inputting, to the circuit under test 60, the carrier signal and the additional signal having a frequency different from that of the carrier signal.

Figure 2:
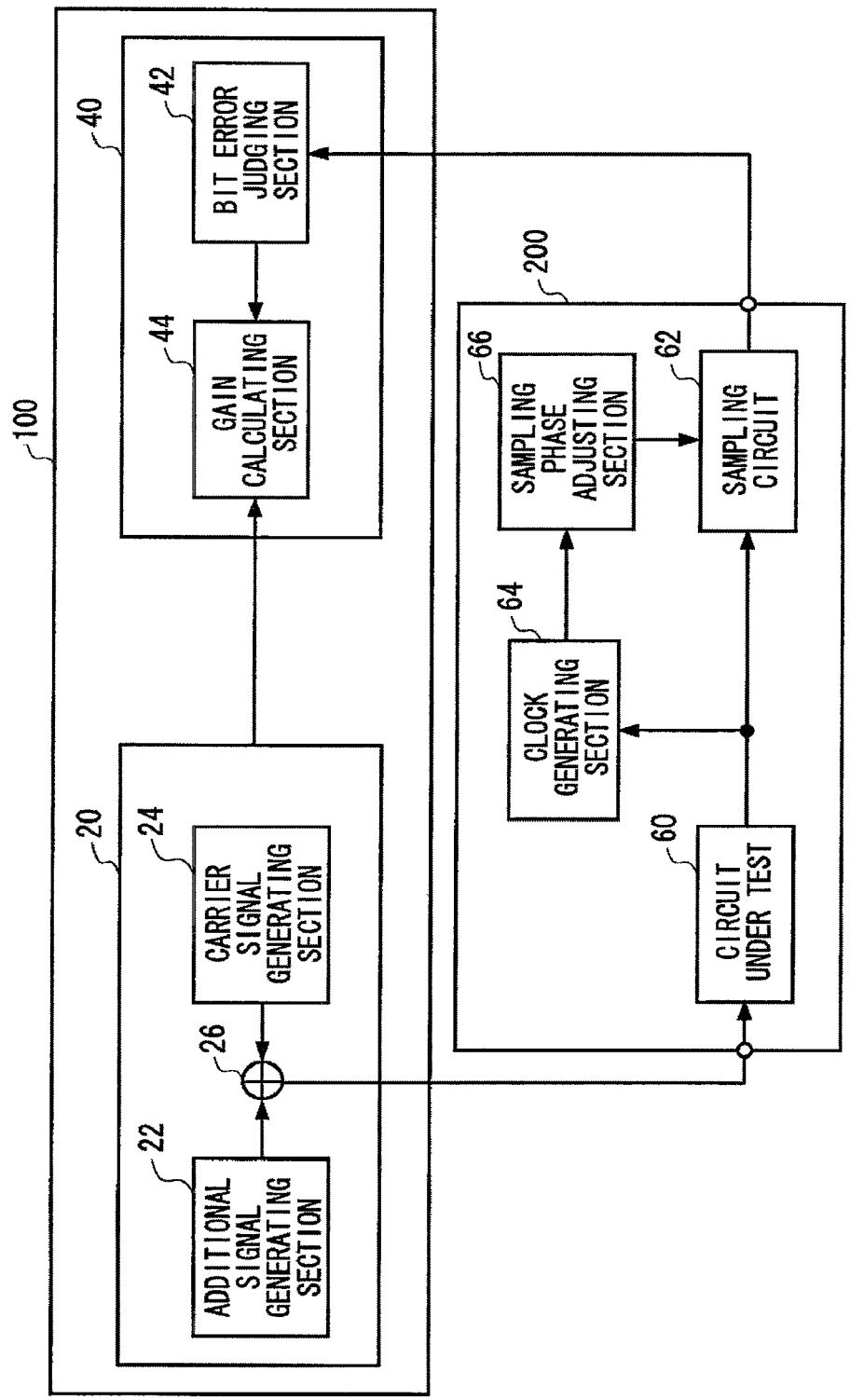
FIG. 2 shows a configuration of a transfer characteristic measurement apparatus 100 according to a second embodiment of the present invention.

FIG. 2 shows a configuration of the transfer characteristic measurement apparatus 100 according to a second embodiment of the present invention. A semiconductor chip 200 is connected to the transfer characteristic measurement apparatus 100. The circuit under test 60 is formed on the semiconductor chip 200, corrects a signal input to the semiconductor chip 200, and outputs the corrected signal. The semiconductor chip 200 further includes a sampling circuit 62 that samples the output signal from the circuit under test 60 at the frequency of the carrier signal.

The test signal input section 20 inputs the test signal to the semiconductor chip 200. The test signal input section 20 includes an additional signal generating section 22, a carrier signal generating section 24, and an adding section 26. The transfer characteristic measuring section 40 includes a bit error judging section 42 and a gain calculating section 44. The transfer characteristic measuring section 40 measures the transfer characteristic of the circuit under test 60 at the frequency of the additional signal, based on the sampling result of the sampling circuit 62.

More specifically, the test signal input section 20 uses the additional signal generating section 22 to generate an additional signal having a sequentially changing amplitude. In the test signal input section 20, the adding section 26 creates the test signal by adding together the carrier signal generated by the carrier signal generating section 24 and the additional signal generated by the additional signal generating section 22, and the test signal input section 20 inputs the test signal to the circuit under test 60. In the test signal, the amplitude of the carrier signal is modulated by the additional signal.

The circuit under test 60 inputs, to the sampling circuit 62, a signal obtained by correcting the gain or phase of the test signal received from the test signal input section 20. The sampling circuit 62 samples the signal output by the circuit under test 60 at a prescribed sampling phase, and outputs the sampling result.

The sampling circuit 62 may perform this sampling at the center of the eye opening of the signal output by the circuit under test 60. For example, the sampling circuit 62 detects the center of the eye opening by receiving a test signal to which the additional signal is not added, and then detecting bit errors by changing the phase of the test signal and comparing the resulting values to expected values of the test signal.

The bit error judging section 42 judges whether the sampling result received from the sampling circuit 62 matches the expected value. The gain calculating section 44 calculates the gain characteristic of the circuit under test 60 based on the judgment result of the bit error judging section 42 and the amplitude of the additional signal. The gain calculating section 44 may receive, from the test signal input section 20, information indicating the amplitude of the carrier signal and the amplitude of the additional signal.

The test signal input section 20 causes the circuit under test 60 to increase the amplitude of the additional signal each time a predetermined number of bits of the test signal are input. When the amplitude of the additional signal increases, the eye opening becomes smaller. When noise is not taken into consideration, the eye of the output signal from the circuit under test 60 closes when the amplitude of the additional signal increases to a point at which the amplitude of the carrier signal on the output side of the circuit under test 60 is equal to the amplitude of the additional signal on the output side of the circuit under test 60, at which point bit errors begin to occur. For example, if the circuit under test 60 has substantially the same gain at every frequency and the amplitude of the carrier signal input to the circuit under test 60 is equal to the amplitude of the additional signal, the amplitude of the carrier signal on the output side of the circuit under test 60 becomes equal to the amplitude of the additional signal, and therefore the eye closes, causing bit errors in the sampling result.

On the other hand, if the circuit under test 60 has different gain at each frequency, the carrier signal and the additional signal have different frequencies, and so the amplitude of the additional signal and the amplitude of the carrier signal input to the circuit under test 60 are not the same when the eye of the output signal from the circuit under test 60 closes. In other words, when the eye of the output signal from the circuit under test 60 closes, (i) a value obtained by multiplying the amplitude of the additional signal by the gain of the circuit under test 60 at the frequency of the additional signal is equal to (ii) a value obtained by multiplying the amplitude of the carrier signal by the gain of the circuit under test 60 at the frequency of the carrier signal. Accordingly, by gradually increasing the amplitude of the additional signal to detect the amplitude of the additional signal at which bit errors begin to occur in the output signal from the circuit under test 60, the transfer characteristic measurement apparatus 100 can calculate the gain of the circuit under test 60 at the frequency of the additional signal, with the gain at the frequency of the carrier signal as a reference.

The gain calculating section 44 calculates the gain characteristic of the circuit under test 60 based on the amplitude of the additional signal at which the bit error rate from the bit error judging section 42 becomes a prescribed value. For example, the gain calculating section 44 may detect the amplitude of the additional signal at which the bit error rate becomes greater than zero.

The gain calculating section 44 calculates the gain characteristic of the circuit under test 60 at the frequency of the additional signal, with the gain characteristic at the frequency of the carrier signal as a reference, based on the ratio between the amplitude of the carrier signal and the amplitude of the additional signal at which the bit error judging section 42 judges bit errors to begin occurring. For example, if the amplitude of the carrier signal is 1 and the amplitude of the additional signal at which bit errors begin occurring is 1/A, where A is a real number greater than or equal to 1, the gain calculating section 44 may calculate the gain characteristic at the frequency of the additional signal to be A times the gain characteristic at the frequency of the carrier signal.

If noise is superimposed on the test signal, bit errors become more likely to occur. Therefore, when the bit error rate is greater than or equal to a prescribed value corresponding to the power of the noise, the gain calculating section 44 may assume the gain characteristic at the frequency of the additional signal to be A times the gain characteristic at the frequency of the carrier signal.

The test signal input section 20 sequentially changes the frequency of the additional signal, and the transfer characteristic measuring section 40 measures the transfer characteristic of the circuit under test 60 at each frequency of the additional signal. When measuring the transfer characteristic, the measurement of the gain characteristic in a frequency band higher than the frequency of the carrier signal is especially important. Therefore, when beginning the measurement, after setting the frequency of the additional signal to be equal to the frequency of the carrier signal, the test signal input section 20 may change the frequency of the additional signal to a sequentially higher frequency.

As another example, the test signal input section 20 may select an initial value for the amplitude of the additional signal, based on a gain characteristic setting value of the circuit under test 60 at the frequency of the additional signal. For example, if the gain characteristic setting value at this frequency is A times the gain characteristic setting value at the frequency of the carrier signal, the initial value of the amplitude of the additional signal may be set to a value that is less than the amplitude 1/A of the carrier signal by a prescribed value. The test signal input section 20 may sequentially increase the amplitude from the selected initial value of the amplitude of the additional signal. If the gain characteristic setting value is not determined, the test signal input section 20 may increase the amplitude of the additional signal from zero.

The transfer characteristic measurement apparatus 100 may supply the semiconductor chip 200 with the sampling clock used for the sampling by the sampling circuit 62. Instead, the semiconductor chip 200 may generate the sampling clock internally. For example, the semiconductor chip 200 may further include the clock generating section 64 and the sampling phase adjusting section 66.

The clock generating section 64 inputs, to the sampling phase adjusting section 66, a clock that is generated using the output signal from the circuit under test 60 and that has the same frequency as the output signal. The sampling phase adjusting section 66 may use the clock output by the clock generating section 64 to adjust the sampling phase to be at the substantial center of the eye opening. For example, the sampling phase adjusting section 66 may adjust the sampling phase by inverting the clock. Instead, the sampling phase adjusting section 66 may include a means for delaying the clock. In this case, the sampling phase adjusting section 66 may detect the center of the eye opening of the carrier signal by changing the delay amount of the clock and using the sampling circuit 62 to sample the carrier signal to which the additional signal is not added.

As described above, the semiconductor chip 200 of the present embodiment includes the circuit under test 60, and does not have a terminal for directly outputting the output signal of the circuit under test 60 to the outside. Therefore, even if the transfer characteristic measurement apparatus 100 cannot directly measure the output signal from the circuit under test 60, the transfer characteristic measurement apparatus 100 can evaluate the gain characteristic of the circuit under test 60.

Figure 3:
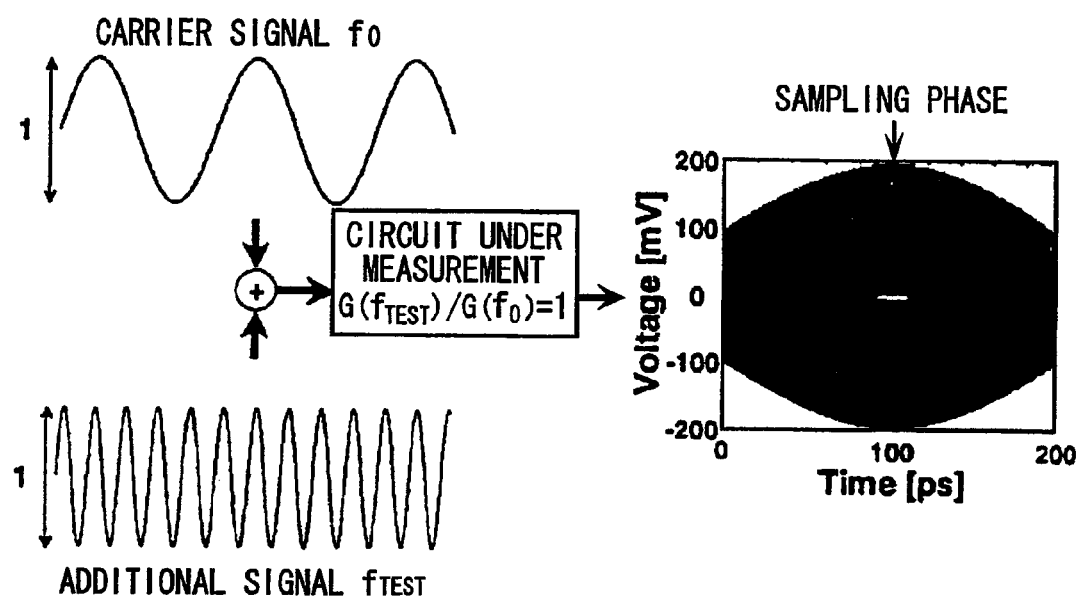
FIG. 3 shows an exemplary method by which the transfer characteristic measurement apparatus 100 calculates the gain characteristic.
Figure 4:
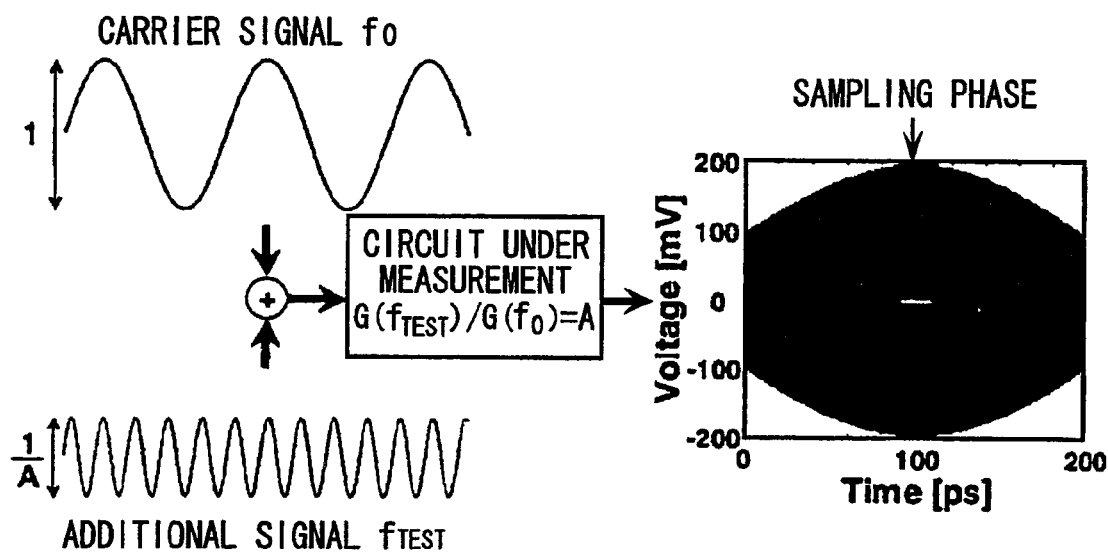
FIG. 4 shows an exemplary method by which the transfer characteristic measurement apparatus 100 calculates the gain characteristic.

FIGS. 3 and 4 show an exemplary method by which the transfer characteristic measurement apparatus 100 calculates the gain characteristic. In FIG. 3, the carrier signal generated by the carrier signal generating section 24 has a frequency $f_0$, and the additional signal to be added to the carrier signal is generated by the additional signal generating section 22 to have a frequency $f_{TEST}$. The signal resulting from this addition is input to the circuit under test 60. It is desirable that the additional signal be a single frequency sinusoidal wave, so that the transfer characteristic measurement apparatus 100 can acquire the gain frequency at each frequency.

The circuit under test 60 amplifies each frequency component included in the input signal according to the gain at the corresponding frequency. When the gain $G(f_0)$ at the frequency $f_0$ is the same as the gain $G(f_{TEST})$ at the frequency $f_{TEST}$ in the circuit under test 60, the circuit under test 60 outputs a signal with an amplitude ratio equal to that of the input signal.

For example, if the carrier signal and the additional signal both have amplitudes of 100 mV, the signal voltage at the sampling phase of the sampling circuit 62 changes within a range from 100 mV±100 mV to −100 mV±100 mV. In other words, the signal voltage at the sampling phase can be any voltage between −200 mV and 200 mV. Accordingly, the eye observed by the sampling circuit 62 is in a closed state, and bit errors occur.

If the amplitude of the additional signal is less than the amplitude of the carrier signal, the eye is in an opened state. For example, if the amplitude of the carrier signal is 100 mV and the amplitude of the additional signal is 50 mV, the signal voltage at the sampling phase of the sampling circuit 62 changes within a range from 100 mV±50 mV to −100 mV±50 mV. Accordingly, the signal voltage is between −50 mV and 50 mV, and in this range the eye is in an opened state so that bit errors do not occur.

On the other hand, if the gain characteristic of the circuit under test 60 is different at the frequency $f_0$ than at the frequency $f_{TEST}$, the eye closes even if the amplitude of the additional signal is less than the amplitude of the carrier signal. For example, if the gain $G(f_{TEST})$ at the frequency $f_{TEST}$ is A times the gain $G(f_0)$ at the frequency $f_0$, as shown in FIG. 4, the eye closes when the amplitude of the additional signal is 1/A times the amplitude of the carrier signal. Even if A is less than or equal to 1, the eye can be in a closed state if the amplitude of the additional signal is greater than the amplitude of the carrier signal.

Accordingly, when the amplitude of the additional signal becomes 1/A times the amplitude of the carrier signal, the bit error judging section 42 compares the value of the signal output by the sampling circuit 62 to the expected value and judges that an error has occurred. The gain calculating section 44 calculates the gain characteristic at the frequency $f_{TEST}$ to be A, based on the judgment result of the bit error judging section 42 and the ratio between the amplitude of the additional signal and the amplitude of the carrier signal.

The test signal input section 20 desirably sets the frequency $f_{TEST}$ of the additional signal to be a frequency that is not an integer multiple of the frequency $f_0$ of the carrier signal. If the frequency $f_{TEST}$ of the additional signal is an integer multiple of the frequency $f_0$ of the carrier signal, the difference in amplitude between the carrier signal and the additional signal at the sampling phase will always be the same. As a result, the eye might not close.

Figure 5:
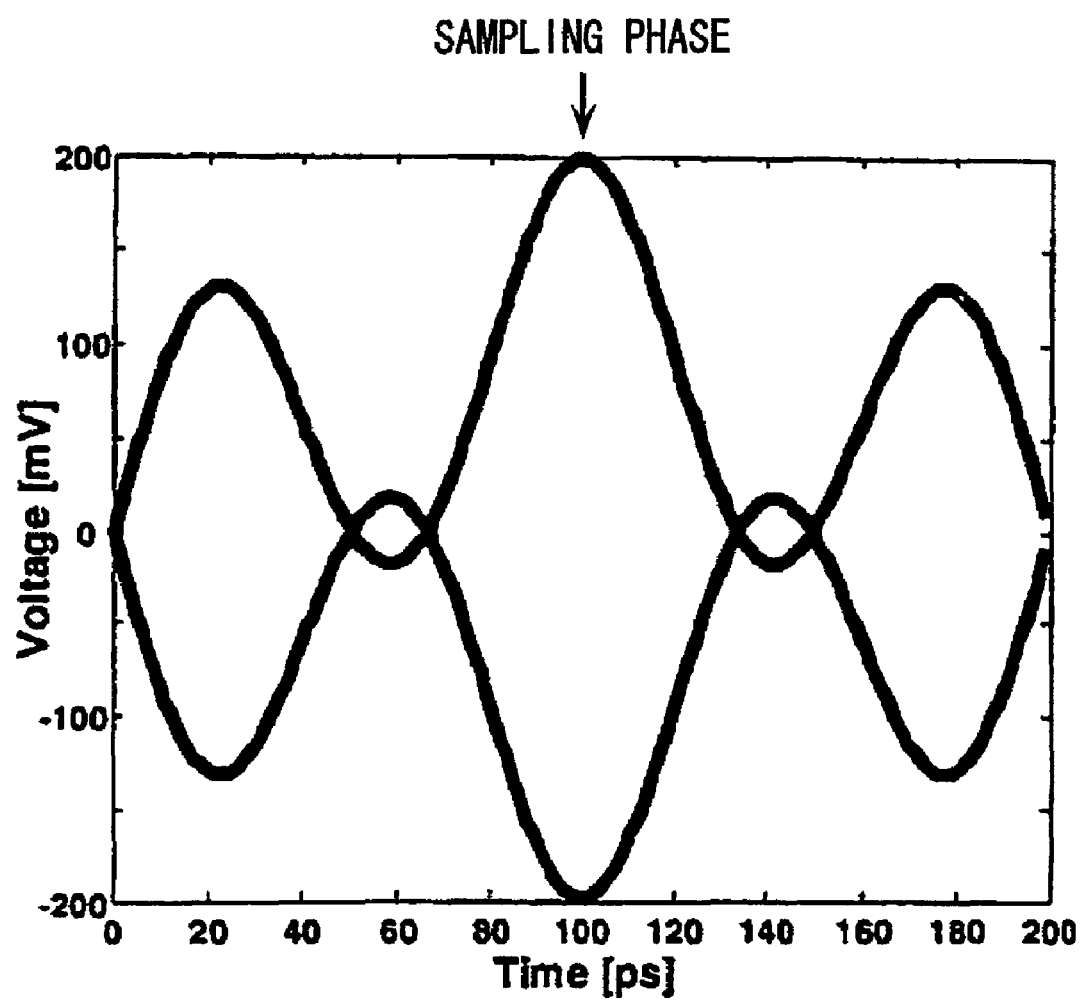
FIG. 5 shows the waveform of the test signal when the additional signal has a frequency $f_{TEST}$ that is 5 times the frequency $f_0$ of the carrier signal.

FIG. 5 shows the waveform of the test signal when the additional signal has an amplitude of 100 mV and a frequency $f_{TEST}$ that is 5 times the frequency $f_0$ of the carrier signal, which also has an amplitude of 100 mV. In FIG. 5, the value of the test signal at the sampling phase can be a value between −200 mV and 200 mV. Accordingly, the eye does not close, and so the gain characteristic cannot be calculated based on the bit error.

Therefore, the test signal input section 20 desirably selects a frequency $f_{TEST}$ that is near the frequency at which the transfer characteristic is to be measured and that causes the greatest common denominator of the frequency $f_{TEST}$ and the frequency $f_0$ of the carrier signal to be the smallest value possible. If the frequency $f_{TEST}$ is an integer multiple of the frequency $f_0$ of the carrier signal, the test signal input section 20 may dynamically control the phase of the additional signal to close the eye by dynamically changing the phase shift amount between the carrier signal and the additional signal.

Figure 6:
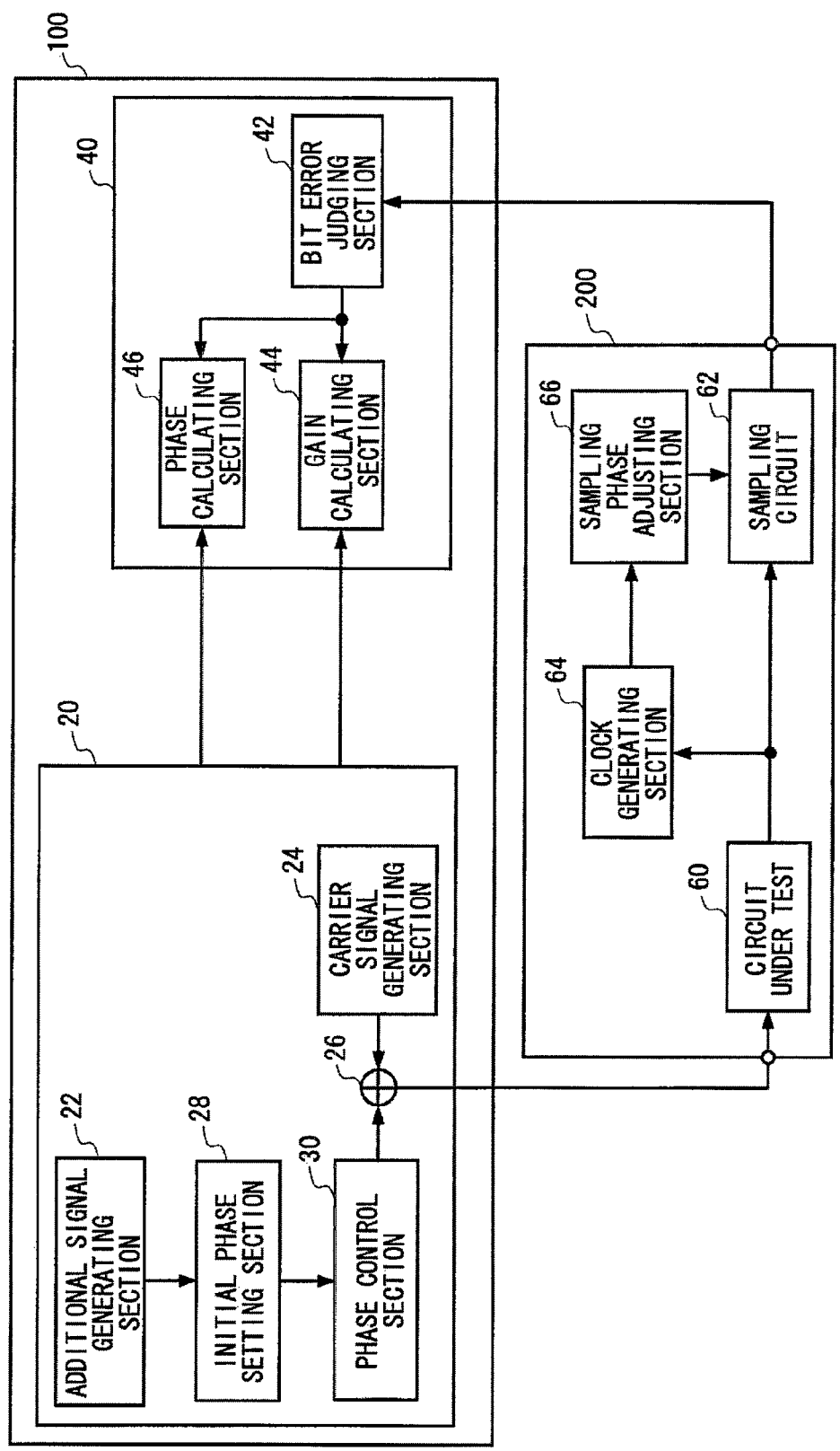
FIG. 6 shows a configuration of a transfer characteristic measurement apparatus 100 according to a third embodiment of the present invention.

FIG. 6 shows a configuration of the transfer characteristic measurement apparatus 100 according to a third embodiment of the present invention. The transfer characteristic measurement apparatus 100 measures the phase characteristic of the circuit under test 60. In the transfer characteristic measurement apparatus 100 of the third embodiment, the test signal input section 20 includes an initial phase setting section 28 and a phase control section 30, the transfer characteristic measuring section 40 further includes a phase calculating section 46, and the remaining configuration is the same as that shown in FIG. 2. The transfer characteristic measurement apparatus 100 sets the amplitude of the additional signal for the measurement of the phase characteristic, based on the gain characteristic measured at the measurement frequency. For example, if the gain at this frequency is A times the gain at the frequency of the carrier signal, the transfer characteristic measurement apparatus 100 may set the amplitude of the additional signal to be 1/A times the amplitude of the carrier signal.

The test signal input section 20 sequentially changes the phase of the additional signal beginning with an initial phase. The initial phase setting section 28 sets the initial phase of the additional signal. More specifically, when the test signal is input to the sampling circuit 62 without passing through the circuit under test 60, the initial phase setting section 28 adjusts the phase between of the additional signal relative to that of the carrier signal so as to cause a bit error in the sampling result by the sampling circuit 62, and sets this phase as the initial phase of the additional signal. While controlling the semiconductor chip 200 and holding the function of the circuit under test 60 in an inactive state, the transfer characteristic measurement apparatus 100 may input, to the semiconductor chip 200, a test signal having the initial phase setting.

With the frequency of the additional signal set to be equal to the frequency of the carrier signal, the transfer characteristic measurement apparatus 100 may input the test signal to the circuit under test 60 to detect the bit error in a state where the circuit under test 60 is unaffected by the phase characteristic. With the frequency of the additional signal set to be equal to the frequency of the carrier signal, the initial phase setting section 28 may adjust the relative phase to close the eye at a phase in the substantial center of the eye.

The initial phase setting section 28 may set the initial phase value by adjusting the relative phase to cause bit errors in all of the sampling results. After the initial phase setting section 28 has set the initial phase, the additional signal generating section 22 may change the frequency of the additional signal, while keeping the relative phase as the initial phase, by changing the frequency of the additional signal to be an integer multiple of the frequency of the carrier signal.

Next, the phase control section 30 sequentially changes the relative phase of the additional signal to the carrier signal beginning with the value set by the initial phase setting section 28. The adding section 26 adds, to the carrier signal, the additional signal whose phase is sequentially changed by the phase control section 30. The adding section 26 inputs the resulting signal to the circuit under test 60.

The phase calculating section 46 calculates the phase characteristic of the circuit under test 60 based on the judgment result of the bit error judging section 42 and the phase of the additional signal. More specifically, the phase calculating section 46 calculates the phase characteristic of the circuit under test 60 based on the amount of the phase change by the phase control section 30 when a bit error occurs in the sampling result of the sampling circuit 62 when the test signal is input to the circuit under test 60. The phase calculating section 46 may calculate the phase characteristic of the circuit under test 60 based on the amount of the phase change by the phase control section 30 when a bit error occurs in the sampling result of the sampling circuit 62. The phase calculating section 46 may calculate the phase characteristic of the circuit under test 60 based on the amount of the phase change by the phase control section 30 when the bit error rate in the sampling result of the sampling circuit 62 exceeds a prescribed value.

Figure 7:
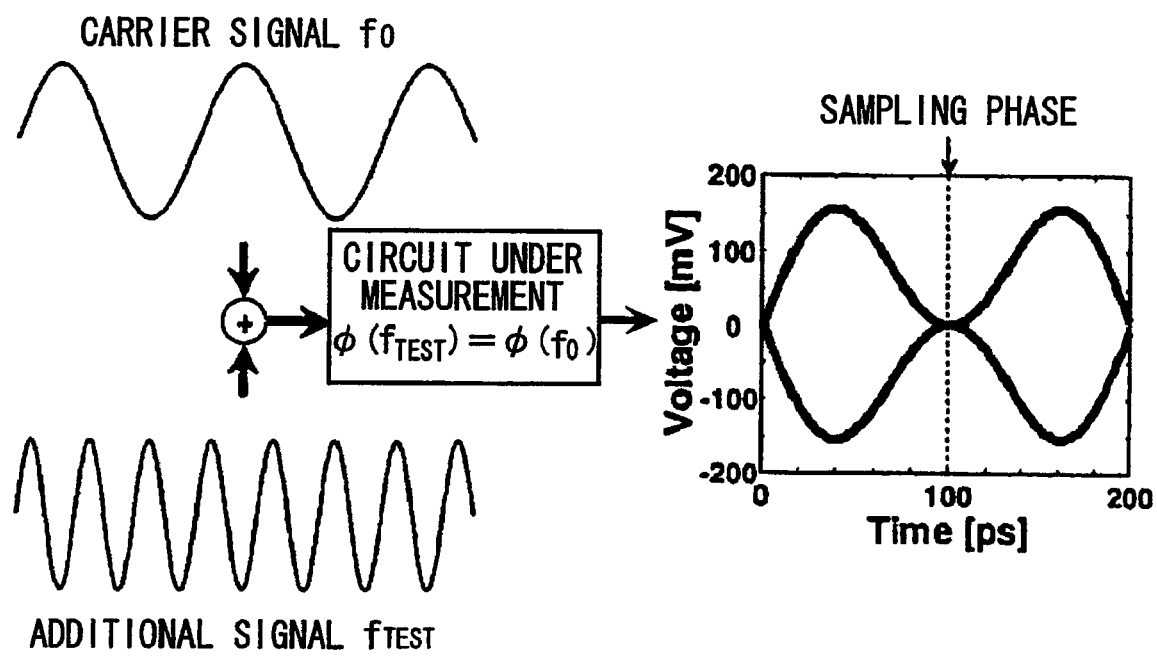
FIG. 7 shows an exemplary test signal in a case where a bit error occurs in the sampling result.

FIG. 7 shows an exemplary test signal in a case where a bit error occurs in the sampling result. Since the relative phase of the additional signal with respect to the carrier signal is equal to the initial phase, the test signal is input to the sampling circuit 62 without passing through the circuit under test 60, and therefore a bit error occurs.

Accordingly, when the phase characteristic $\phi(f_0)$ at the frequency $f_0$ of the carrier signal is equal to the phase characteristic $\phi(f_{TEST})$ at the frequency $f_{TEST}$ of the additional signal in the circuit under test 60, a bit error occurs in the sampling result of the signal output by the circuit under test 60 when this test signal is input to the circuit under test 60. In FIG. 7, for example, at a sampling phase at which the voltage of the carrier signal is at the maximum value, i.e. a logic value of 1, the voltage of the test signal is 0, i.e. a logic value of 0. As a result, the bit error judging section 42 judges that a bit error occurs in the sampling result.

Figure 8:
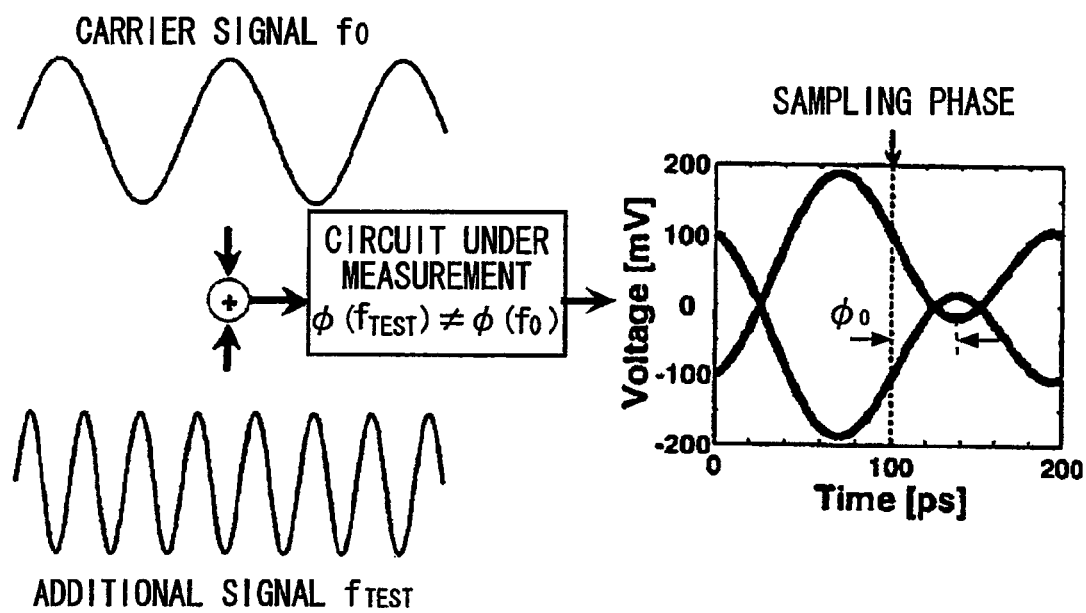
FIG. 8 shows an exemplary test signal in a case where a bit error does not occur in the sampling result.

FIG. 8 shows an exemplary test signal in a case where a bit error does not occur in the sampling result. In the circuit under test 60 of FIG. 8, the phase characteristic $\phi(f_0)$ at the frequency $f_0$ of the carrier signal differs from the phase characteristic $\phi(f_{TEST})$ at the frequency $f_{TEST}$ of the additional signal.

For example, in the circuit under test 60, if the phase at the frequency $f_{TEST}$ is delayed by $\phi_0$ relative to the phase at the frequency $f_0$, the phase of the additional signal is delayed by $\phi_0$ relative to the carrier signal. As a result, the signal voltage at the sampling phase can be a value from 100 mV to −100 mV, as shown in FIG. 8. In this case, the bit error judging section 42 judges that a bit error does not occur in the sampling result of the test signal.

If the relative phase becomes $\phi_0$ when the adding section 26 sequentially changes the relative phase between the additional signal and the carrier signal, as shown in FIG. 7, the voltage of the test signal at the sampling phase is a minimum value, and a bit error occurs. Therefore, upon receiving notification from the bit error judging section 42 that a bit error has occurred, the phase calculating section 46 calculates the phase characteristic of the circuit under test 60 at the frequency $f_{TEST}$ to be $\phi_0$ by acquiring the relative phase of the additional signal from the test signal input section 20.

The test signal input section 20 may control the frequency of the additional signal such that the frequency $f_{TEST}$ is an integer multiple of the frequency $f_0$. By setting the frequency $f_{TEST}$ to be an integer multiple of the frequency $f_0$, the test signal input section 20 allows easy control of the phase of the additional signal with respect to the phase of the carrier signal, and easy calculation of the initial value for the bit error judging section 42.

The test signal input section 20 may instead select the frequency $f_{TEST}$ such that the ratio between the frequency $f_{TEST}$ and the frequency $f_0$ is an integer value. In this case, the greatest common denominator of the frequency $f_{TEST}$ and the frequency $f_0$ is set as the repeating frequency, so that the phases of the carrier signal and the additional signal are in synchronization. The phase calculating section 46 may calculate an initial value for each period of the repeating frequency, and may then calculate the phase characteristic based on a comparison result between the initial value pattern and the sampling result pattern. For example, the phase calculating section 46 may calculate the phase characteristic at the frequency of the additional signal based on the relative phase of the additional signal at which the sampling result pattern matches the initial value pattern.

As another example, if the ratio between the frequency $f_{TEST}$ and the frequency $f_0$ is not an integer value, the test signal input section 20 may set the phase shift amount of the additional signal relative to the carrier signal when sampling begins to be a known value. More specifically, the phase calculating section 46 may calculate the initial value of the sampling result at each sampling phase using the phase shift amount when the sampling begins and the number of samplings. The phase calculating section 46 may calculate the phase characteristic based on the judgment result of the bit error judging section 42 and the above comparison with the initial values.

As described above, the transfer characteristic measurement apparatus 100 measures the phase characteristic by sequentially changing the relative phase of the additional signal with respect to the carrier signal. As a result, the transfer characteristic measurement apparatus 100 can evaluate the phase characteristic of the circuit under test 60 even when the output signal of the circuit under test 60 cannot be directly measured.

Figure 9A:
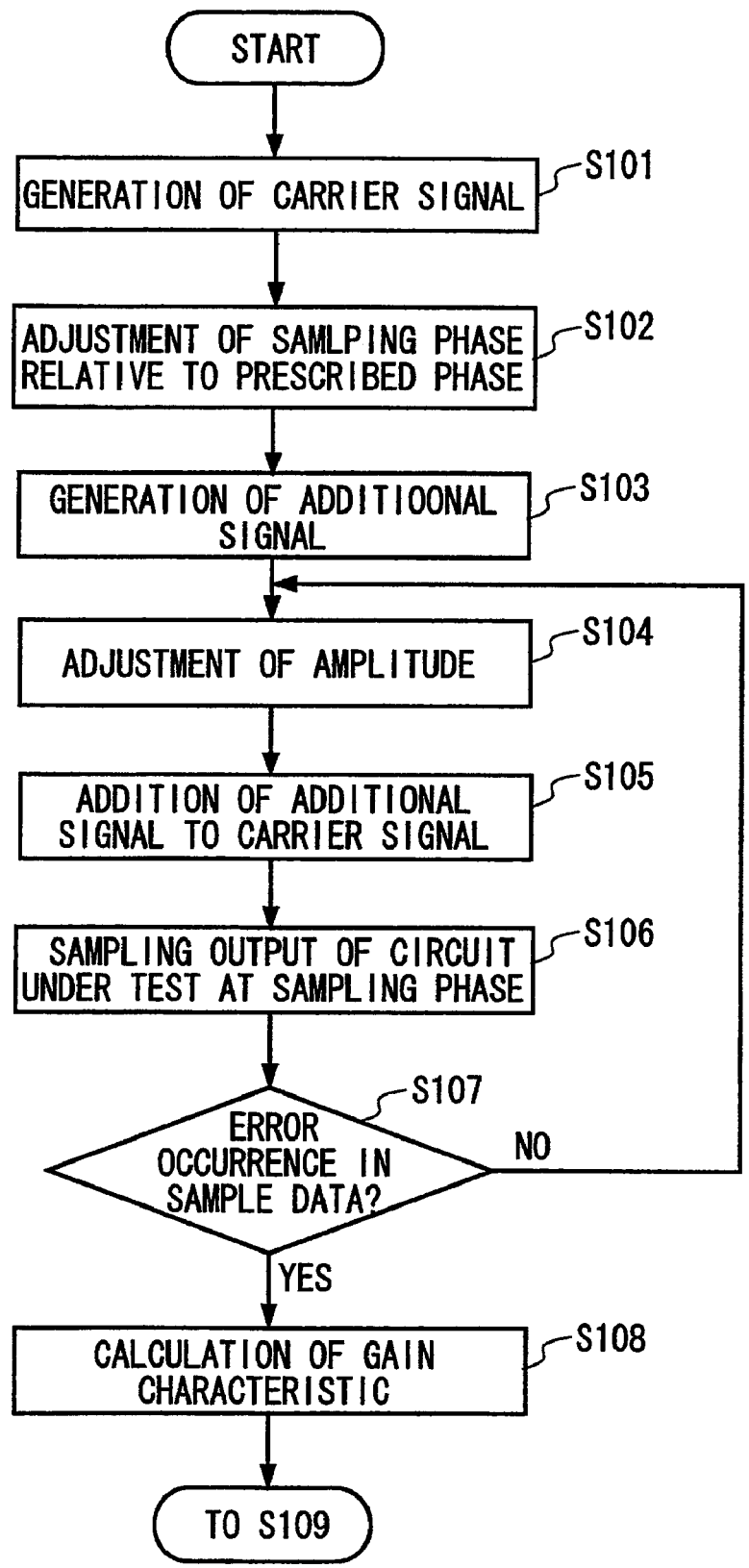
FIG. 9A is a flow chart showing sequential calculation of the gain characteristic and the phase characteristic.
Figure 9B:
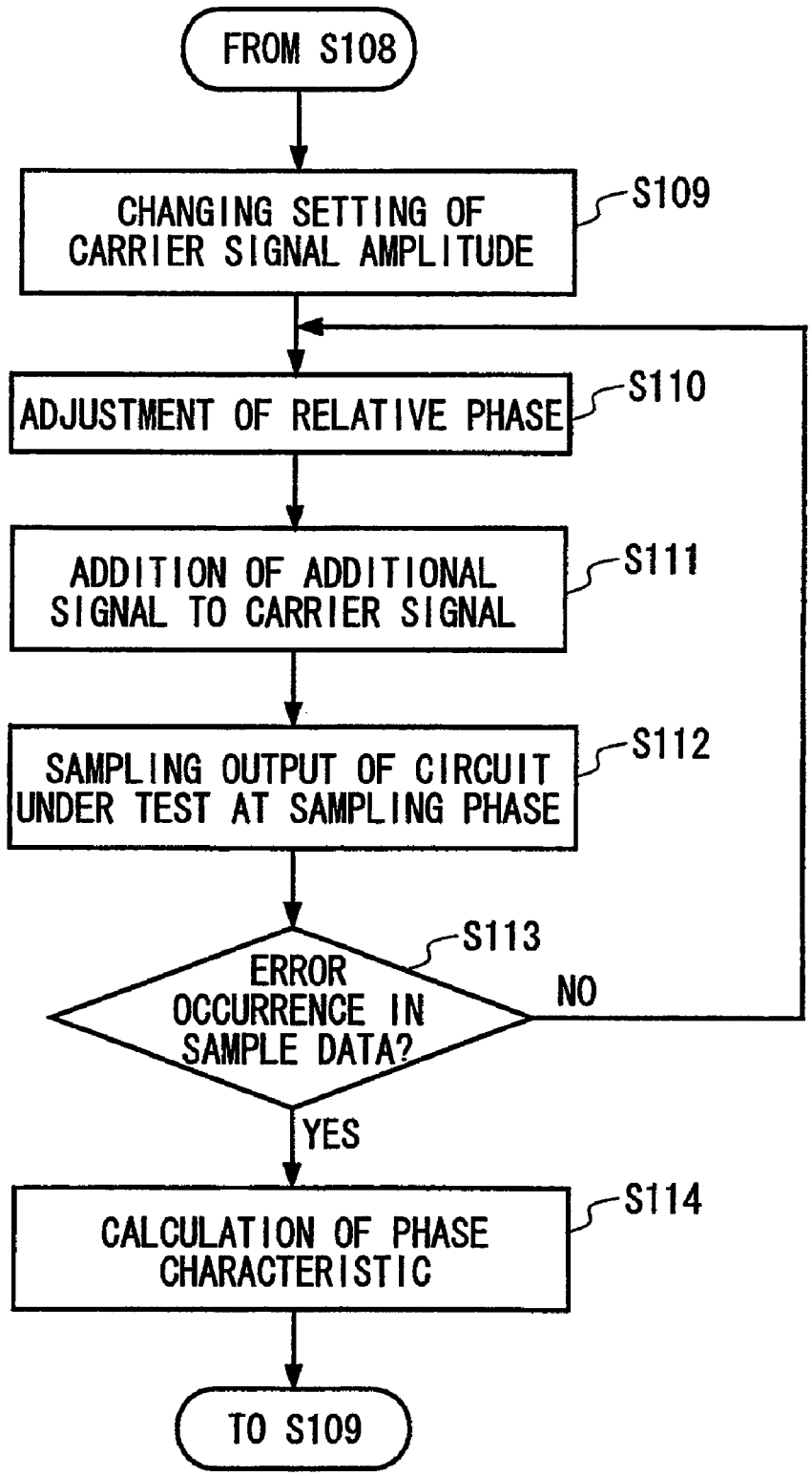
FIG. 9B is a flow chart showing sequential calculation of the gain characteristic and the phase characteristic.

FIGS. 9A and 9B are flow charts showing sequential calculation of the gain characteristic and the phase characteristic. First, the test signal input section 20 uses the carrier signal generating section 24 to generate the carrier signal, and inputs the carrier signal to the semiconductor chip 200 (S101). The clock generating section 64 generates a clock from the signal output by the circuit under test 60. The sampling phase adjusting section 66 adjusts the sampling phase relative to the phase of the clock (S102).

Next, the additional signal generating section 22 generates the additional signal (S103). The additional signal generating section 22 adjusts the amplitude of the additional signal relative to the amplitude of the carrier signal (S104). The adding section 26 adds the additional signal to the carrier signal, and inputs the resulting signal to the semiconductor chip 200 (S105).

In the semiconductor chip 200, the sampling circuit 62 samples the signal output by the circuit under test 60, at the sampling phase adjusted at S101 (S106). If the bit error judging section 42 judges at S107 that there is no bit error in the sampling result, the test signal input section 20 readjusts the amplitude of the additional signal relative to the carrier signal (S104).

The transfer characteristic measurement apparatus 100 repeats the processes from S104 to S106 until the bit error judging section 42 detects a bit error in the sampling result. When the bit error judging section 42 judges at S107 that there is a bit error in the sampling result, the gain calculating section 44 calculates the gain characteristic of the circuit under test 60 based on the judgment result of the bit error judging section 42 and the amplitude adjusted at S104 (S108). The transfer characteristic measurement apparatus 100 may repeat the processes from S101 to S108 for all frequencies at which the gain characteristic is to be measured.

After measuring the gain characteristic, the transfer characteristic measurement apparatus 100 sets the frequency of the additional signal to a frequency at which the phase characteristic is to be measured, and sets the amplitude of the additional signal to an amplitude at which a bit error occurs, according to the gain characteristic measurement result (S109). The initial phase setting section 28 sets the relative phase of the additional signal with respect to the carrier signal such that a bit error occurs in the sampling result of the sampling circuit 62 (S110).

Next, the adding section 26 adds the additional signal to the carrier signal, and inputs the resulting signal to the circuit under test 60 (S111). The sampling circuit 62 samples the signal output by the circuit under test 60, at the sampling phase adjusted at S101 (S112). If the bit error judging section 42 judges at step S113 that there is no bit error in the sampling result or that the sampling result pattern differs from the expected sampling result pattern, the test signal input section 20 readjusts the relative phase of the additional signal (S110).

The transfer characteristic measurement apparatus 100 repeats the processes from S110 to S112 until the bit error judging section 42 detects a bit error in the sampling result or until the sampling result pattern matches the expected sampling result pattern. When the bit error judging section 42 judges that that there is a bit error in the sampling result or that the sampling result pattern matches the expected sampling result pattern, the phase calculating section 46 calculates the phase characteristic of the circuit under test 60 based on the judgment result of the bit error judging section 42 and the relative phase set at S110 (S114). The transfer characteristic measurement apparatus 100 may repeat the processes from S109 to S114 for every frequency at which the phase characteristic is to be measured.

Through the processes described above, the transfer characteristic measurement apparatus 100 of the present embodiment can sequentially measure the gain characteristic and the phase characteristic.

Figure 10:
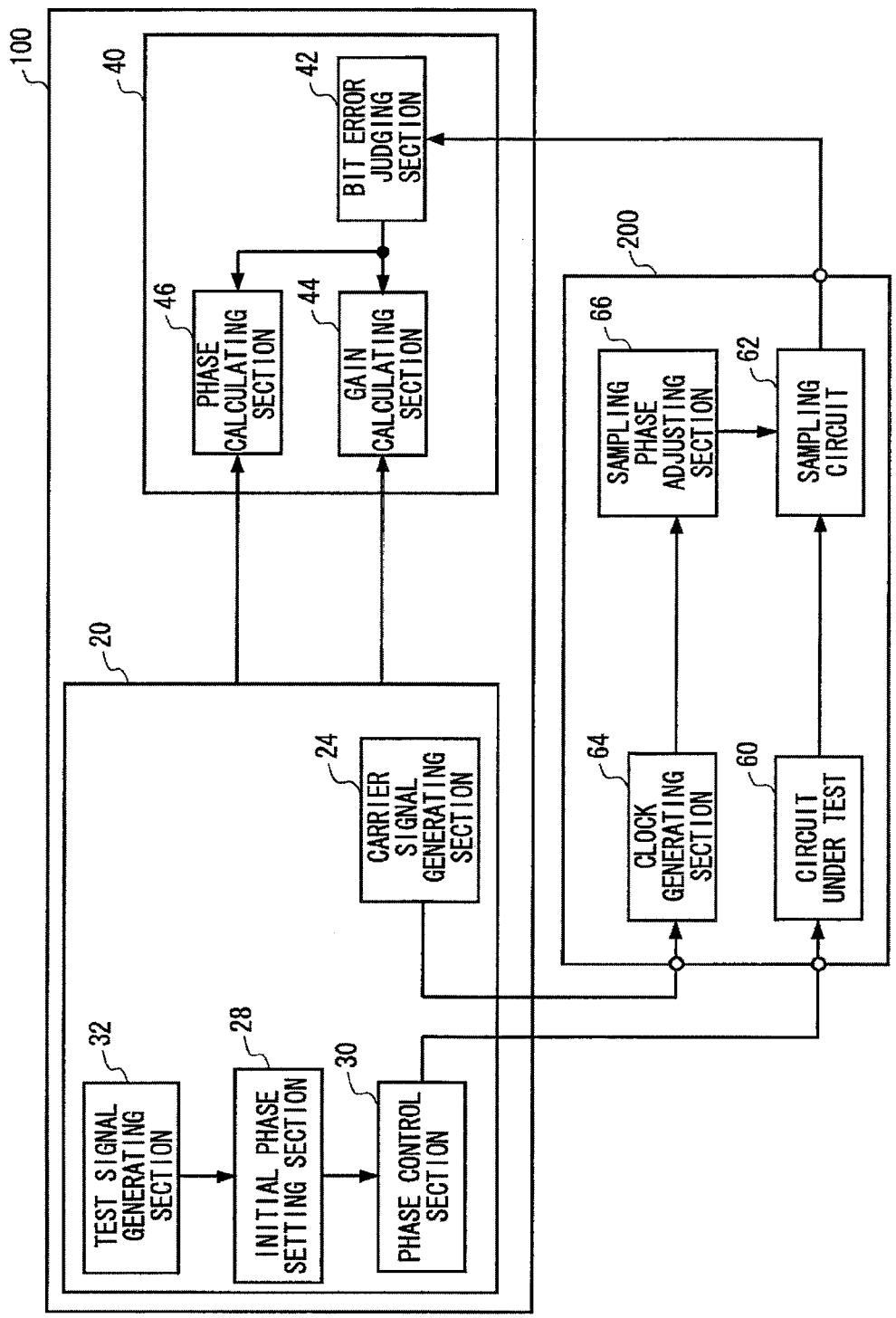
FIG. 10 shows a configuration of a transfer characteristic measurement apparatus 100 according to a fourth embodiment of the present invention.

FIG. 10 shows a configuration of the transfer characteristic measurement apparatus 100 according to a fourth embodiment of the present invention. The transfer characteristic measurement apparatus 100 of the present embodiment calculates the phase characteristic of the circuit under test 60 by supplying the circuit under test 60 with the test signal having a different frequency than that of the carrier signal, without adding the carrier signal thereto. The test signal input section 20 includes a test signal generating section 32 in place of the additional signal generating section 22. The carrier signal generating section 24 inputs the carrier signal to the clock generating section 64.

The clock generating section 64 generates a clock in synchronization with the carrier signal output by the carrier signal generating section 24. The sampling phase adjusting section 66 sets the sampling phase according to the clock.

The test signal generating section 32 generates the test signal with a frequency equal to the carrier frequency. The initial phase setting section 28 adjusts the phase of the test signal such that the sampling result of the sampling circuit 62, obtained when the test signal is input to the sampling circuit 62 without passing through the circuit under test 60, matches a prescribed expected value pattern. The transfer characteristic measurement apparatus 100 may turn the function of the circuit under test 60 on or off, and may turn off the function of the circuit under test 60 when adjusting the phase of the test signal. The initial phase setting section 28 may store, as a reference phase, the phase difference between the phase of the adjusted test signal and the sampling phase.

The test signal generating section 32 generates the test signal having a frequency $f_{TEST}$ that is different from the frequency $f_0$ of the carrier signal supplied during actual operation of the circuit under test 60. The phase control section 30 sequentially changes the phase of the test signal beginning at the value set by the initial phase setting section 28.

The transfer characteristic measuring section 40 measures the phase characteristic of the circuit under test 60 at the frequency of the test signal, based on the sampling result acquired by sampling the output signal from the circuit under test 60 according to the frequency of the carrier signal. More specifically, the transfer characteristic measuring section 40 calculates the phase characteristic of the circuit under test 60 based on the amount of phase change by the phase control section 30 when the sampling result obtained by the sampling circuit 62 when the test signal is input to the circuit under test 60 matches the prescribed expected value pattern.

Figure 11:
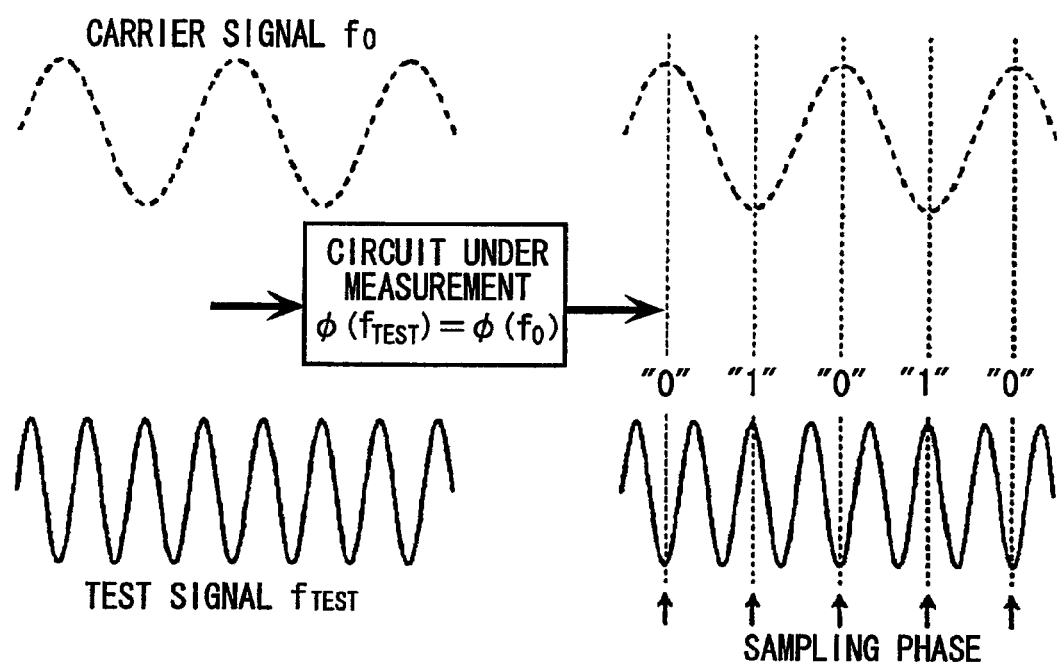
FIG. 11 shows an input signal and an output signal of the circuit under test 60 in a case where the circuit under test 60 has the same phase characteristic at the frequency of $f_{TEST}$ of the test signal and the frequency $f_0$ of the carrier signal.

FIG. 11 shows an input signal and an output signal of the circuit under test 60 in a case where the circuit under test 60 has the same phase characteristic at the frequency $f_{TEST}$ of the test signal and the frequency $f_0$ of the carrier signal. At a sampling frequency at which the amplitude of the carrier signal with a frequency $f_0$ output by the circuit under test 60 is at a maximum or a minimum, the amplitude of the test signal with a frequency $f_{TEST}$ is also at a maximum or a minimum. Therefore, the expected value pattern at the sampling phase is "0,1,0,1,0, . . ." In other words, the sampling result of the sampling circuit 62 matches the expected value pattern.

Figure 12:
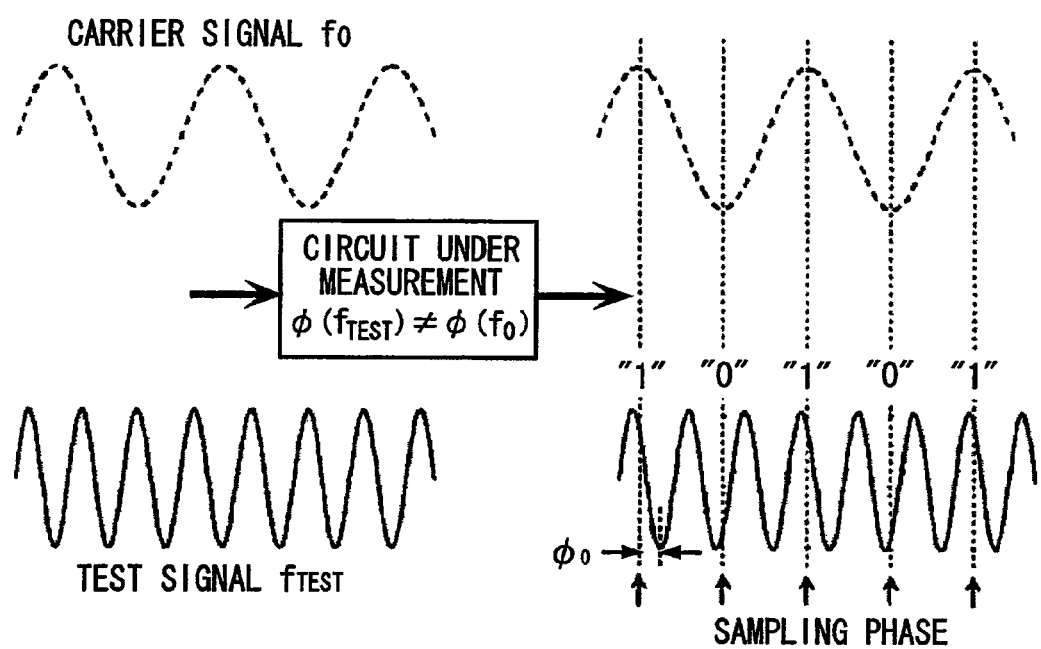
FIG. 12 shows an input signal and an output signal of the circuit under test 60 in a case where there is a phase difference of $\phi$ between the phase characteristic $\phi(f_{TEST})$ at the frequency $f_{TEST}$ of the test signal and the phase characteristic $\phi(f_0)$ at the frequency $f_0$ of the carrier signal.

FIG. 12 shows an input signal and an output signal of the circuit under test 60 in a case where there is a phase difference of $\phi_0$ between the phase characteristic $\phi(f_{TEST})$ at the frequency $f_{TEST}$ of the test signal and the phase characteristic $\phi(f_0)$ at the frequency $f_0$ of the carrier signal. The phase of the test signal input to the sampling circuit 62 is delayed by $\phi_0$ relative to the sampling phase, and therefore the sampling result might not match the expected value pattern.

Therefore, the transfer characteristic measurement apparatus 100 sequentially delays the phase of the test signal to calculate the phase of the test signal at which the bit error rate detected by the bit error judging section 42 is at a minimum value, as shown in FIG. 11. In the example of FIG. 12, this phase is a phase shifted by $\phi_0$ from the reference phase. Therefore, the phase calculating section 46 calculates the phase characteristic of the circuit under test 60 at $f_{TEST}$ to be the phase difference $\phi_0$ between the reference phase and the phase of the test signal at which the bit error rate is at a minimum value.

The test signal input section 20 may select the frequency $f_{TEST}$ such that the ratio between the frequency $f_{TEST}$ and the frequency $f_0$ is an integer value. In this case, the greatest common denominator of the frequency $f_{TEST}$ and the frequency $f_0$ is set as the repeating frequency, so that the phases of the carrier signal and the additional signal are in synchronization. The phase calculating section 46 may calculate an expected value for each period of the repeating frequency, and may then calculate the phase characteristic based on a comparison result between the expected value pattern and the sampling result pattern.

The transfer characteristic measurement apparatus 100 can calculate the expected value of the test signal at the sampling phase based on the phase relationship between the additional signal and the carrier signal input to the circuit under test 60. The transfer characteristic measuring section 40 may calculate the phase characteristic based on the phase of the test signal when the sampling result output by the sampling circuit 62 matches the expected value.

Figure 13:
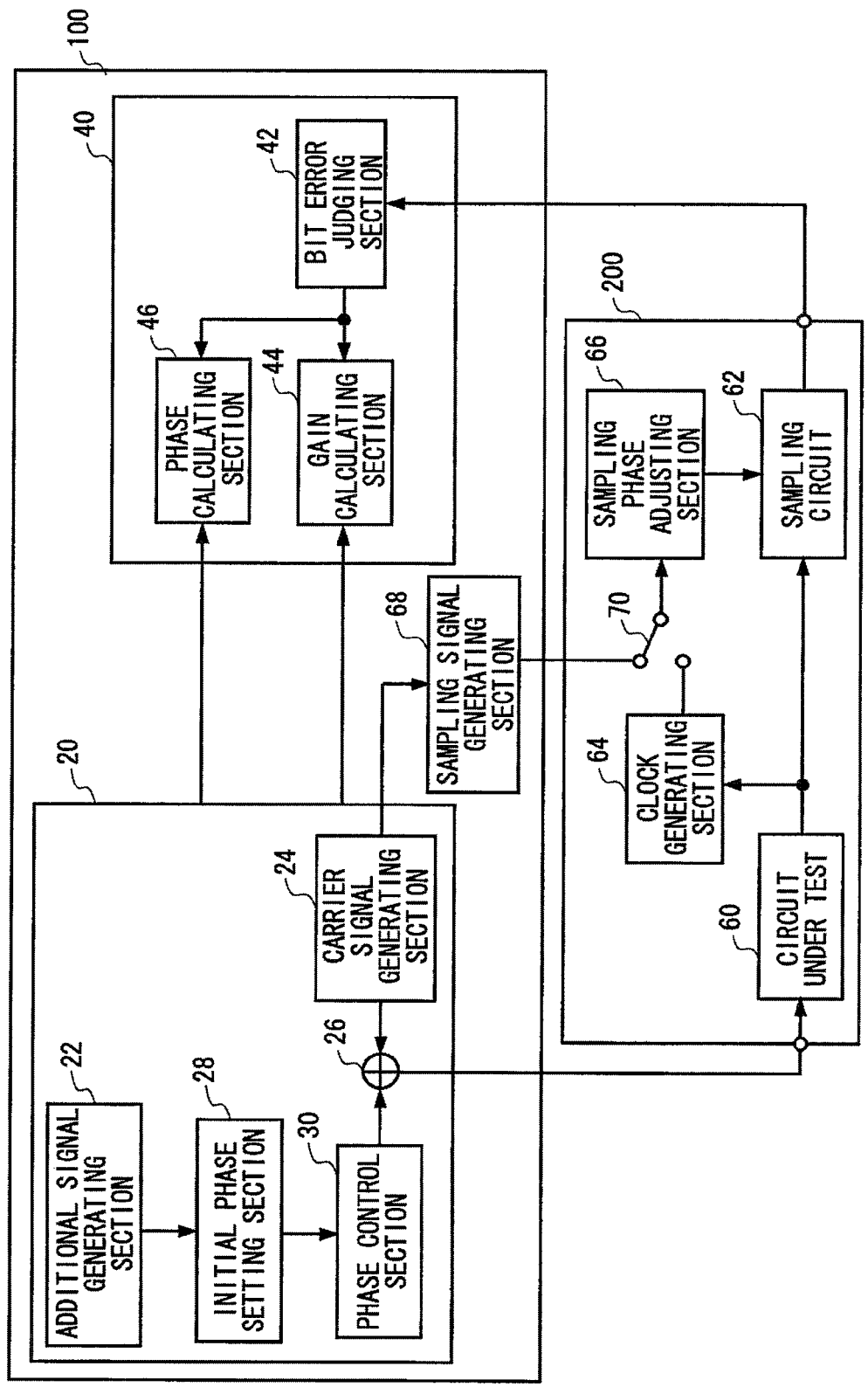
FIG. 13 shows a configuration of a transfer characteristic measurement apparatus 100 according to a fifth embodiment of the present invention.

FIG. 13 shows a configuration of the transfer characteristic measurement apparatus 100 according to a fifth embodiment of the present invention. In FIG. 13, the transfer characteristic measurement apparatus 100 further includes a sampling signal generating section 68, and the semiconductor chip 200 further includes a switching section 70. The sampling signal generating section 68 may instead be included in the semiconductor chip 200, or may replace the clock generating section 64 in the semiconductor chip 200.

The semiconductor chip 200 may switch whether the switching section 70 is connected depending on whether (i) the semiconductor chip 200 is operating normally or (ii) the transfer characteristic is being measured. More specifically, when operating normally, the clock generated by the clock generating section 64 is input to the sampling phase adjusting section 66 based on the signal output by the circuit under test 60. On the other hand, when measuring the transfer characteristics, the semiconductor chip 200 may input the clock generated by the sampling signal generating section 68 to the sampling phase adjusting section 66.

Figure 14:
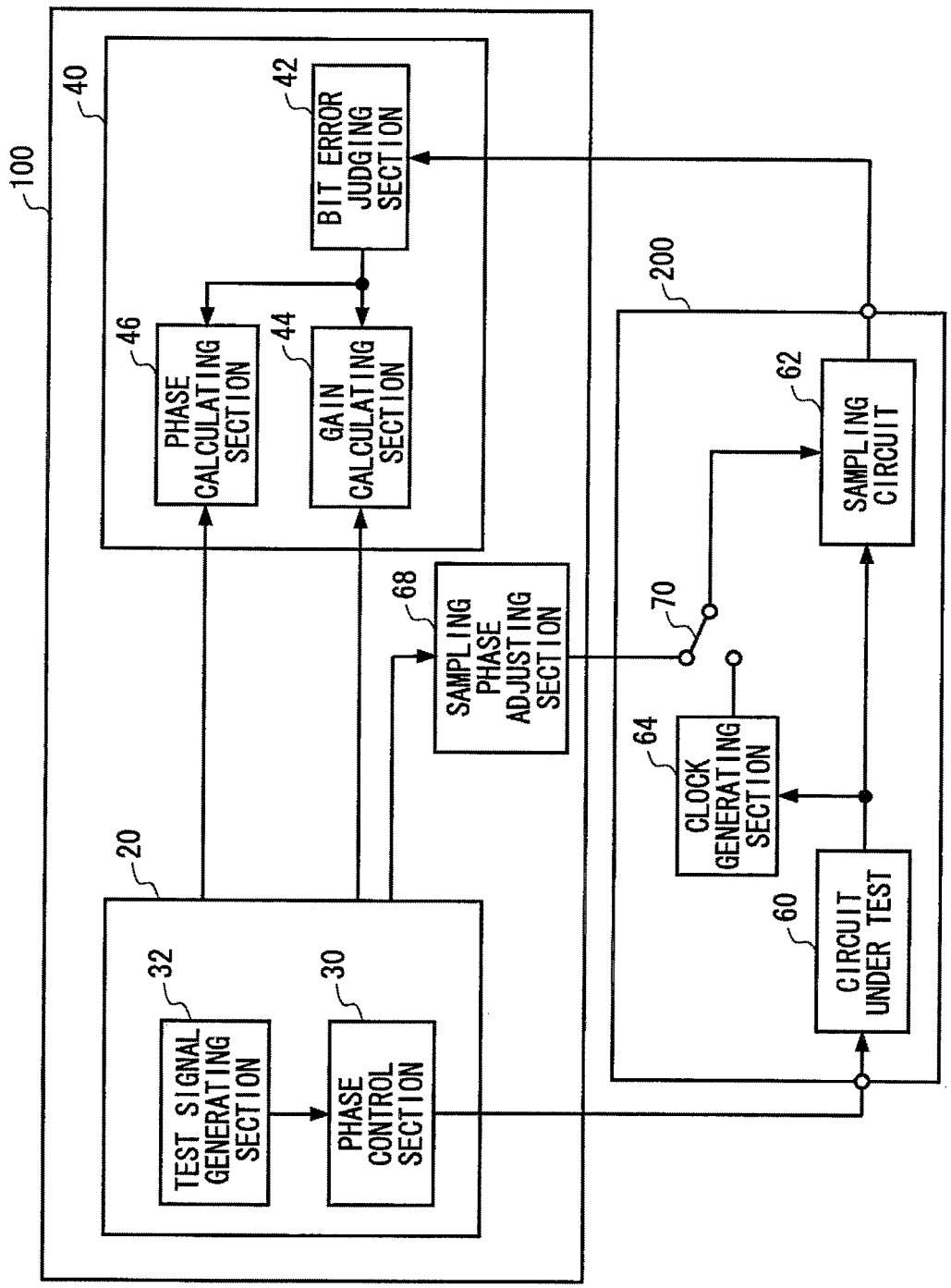
FIG. 14 shows a configuration of a transfer characteristic measurement apparatus 100 according to a sixth embodiment of the present invention.

FIG. 14 shows a configuration of the transfer characteristic measurement apparatus 100 according to a sixth embodiment of the present invention. In FIG. 14, the sampling signal generating section 68 inputs the sampling clock used for measuring the transfer characteristic to the sampling circuit 62. Since the transfer characteristic measurement apparatus 100 generates the sampling clock, it is not necessary for the semiconductor chip 200 to use the carrier signal to adjust the sampling phase when measuring the gain characteristic or the phase characteristic.

Furthermore, in the transfer characteristic measurement apparatus 100 of the present embodiment, the test signal generating section 32 generates the test signal by adding together the carrier signal and the additional signal. For example, the test signal generating section 32 may function as a digital signal processor to generate a test signal with various different amplitudes, phases, and frequencies based on a program.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can be used to realize a transfer characteristic measurement apparatus, a transfer characteristic measurement method, and an electronic device that can measure a transfer characteristic of a circuit under test such as an equalizer without directly measuring the signal waveform output by the circuit under test.

What is claimed is:

1. A transfer characteristic measurement apparatus that measures a transfer characteristic of a circuit under test between input and output, comprising:
    a test signal input section that generates a test signal by adding together a carrier signal having a prescribed frequency and an additional signal having a frequency that differs from the prescribed frequency, and inputs the test signal to the circuit under test; and
    a transfer characteristic measuring section that measures the transfer characteristic of the circuit under test at the frequency of the additional signal based on a result from a measurement of an output signal output by the circuit under test, wherein
    the circuit under test is formed in a semiconductor chip, corrects a signal input to the semiconductor chip, and outputs the corrected signal,
    the semiconductor chip further includes a sampling circuit that samples the output signal of the circuit under test at the frequency of the carrier signal,
    the test signal input section inputs the test signal to the semiconductor chip, and
    the transfer characteristic measuring section measures the transfer characteristic of the circuit under test at the frequency of the additional signal based on the sampling result from the sampling circuit.

2. The transfer characteristic measurement apparatus according to claim 1, wherein
    the test signal input section sequentially changes the frequency of the additional signal, and
    the transfer characteristic measuring section measures the transfer characteristic of the circuit under test at each frequency of the additional signal.

3. The transfer characteristic measurement apparatus according to claim 1, wherein
    the test signal input section sequentially changes a phase of the additional signal, and
    the transfer characteristic measuring section includes:
        a bit error judging section that judges whether the sampling result matches a prescribed value; and
        a phase calculating section that calculates a phase characteristic of the circuit under test based on the judgment result from the bit error judging section and the phase of the additional signal.

4. The transfer characteristic measurement apparatus according to claim 3, wherein
    the test signal input section includes:
        an initial phase setting section that adjusts a relative phase between the additional signal and the carrier signal such that a bit error occurs in the sampling result obtained by the sampling circuit when the test signal is input to the sampling circuit without passing through the circuit under test; and
        a phase control section that sequentially changes the relative phase between the additional signal and the carrier signal, beginning at a value set by the initial phase setting section, and
    the phase calculating section calculates the phase characteristic of the circuit under test based on an amount of the phase change by the phase control section at a time when a bit error occurs in the sampling result from the sampling circuit when the test signal is input to the circuit under test.

5. The transfer characteristic measurement apparatus according to claim 1, wherein
    the test signal input section sequentially changes amplitude of the additional signal, and
    the transfer characteristic measuring section further includes:
        a bit error judging section that judges whether the sampling result matches an expected value; and
        a gain calculating section that calculates a gain characteristic of the circuit under test based on the judgment result from the bit error judging section and the amplitude of the additional signal.

6. The transfer characteristic measurement apparatus according to claim 5, wherein
    the test signal input section increases the amplitude of the additional signal each time a predetermined number of bits of the test signal are input to the circuit under test, and
    the gain calculating section calculates the gain characteristic of the circuit under test based on the amplitude of the additional signal at which the bit error judging section detects a prescribed bit error rate.

7. The transfer characteristic measurement apparatus according to claim 6, wherein
    the gain calculating section calculates the gain characteristic of the circuit under test at the frequency of the additional signal, with the gain characteristic of the circuit under test at the frequency of the carrier signal as a reference, based on a ratio between the amplitude of the carrier signal and the amplitude of the additional signal at which the bit error judging section detects that bit errors begin to occur.

8. A transfer characteristic measurement apparatus that measures a transfer characteristic of a circuit under test between input and output, comprising:
    a test signal input section that inputs, to the circuit under test, a test signal having a frequency different from that of a carrier signal supplied during actual operation of the circuit under test; and
    a transfer characteristic measuring section that measures the transfer characteristic of the circuit under test at the frequency of the test signal based on a result obtained by sampling the output signal from the circuit under test according to the frequency of the carrier signal, wherein
    the circuit under test is formed in a semiconductor chip, corrects a signal input to the semiconductor chip, and outputs the corrected signal,
    the semiconductor chip further includes a sampling circuit that samples the output signal of the circuit under test according to the frequency of the carrier signal, the test signal input section inputs the test signal to the semiconductor chip, and the transfer characteristic measuring section measures the transfer characteristic of the circuit under test at the frequency of the test signal based on the sampling result from the sampling circuit.

9. The transfer characteristic measurement apparatus according to claim 8, wherein the test signal input section includes:

an initial phase setting section that adjusts a phase of the test signal such that a sampling result obtained by the sampling circuit when the test signal is input to the sampling circuit without passing through the circuit under test matches a prescribed expected value pattern; and a phase control section that sequentially changes the phase of the test signal, beginning at a value set by the initial phase setting section, and the transfer characteristic measuring section calculates the phase characteristic of the circuit under test based on an amount of the phase change by the phase control section at a time when a sampling result obtained by the sampling circuit when the test signal is input to the circuit under test matches the prescribed expected value pattern.

10. A method for measuring a transfer characteristic of a circuit under test between input and output, the circuit under test being formed in a semiconductor chip, corrects a signal input to the semiconductor chip, and outputting the corrected signal, comprising:

generating a test signal by adding together a carrier signal having a prescribed frequency and an additional signal having a frequency that differs from the prescribed frequency, and inputting the test signal to the circuit under test;

sampling the corrected signal output from the circuit under test at the frequency of the carrier signal; and measuring the transfer characteristic of the circuit under test at the frequency of the additional signal based on a sampling result of said sampling.

11. An electronic device comprising an operational circuit that corrects a signal input thereto and outputs the corrected signal and a transfer characteristic measurement circuit that measures a transfer characteristic of the operational circuit between input and output, wherein the transfer characteristic measurement circuit includes:

a test signal input section that generates a test signal by adding together a carrier signal having a prescribed frequency and an additional signal having a frequency that differs from the prescribed frequency, and inputs the test signal to the operational circuit; and a transfer characteristic measuring section that measures the transfer characteristic of the operational circuit at the frequency of the additional signal based on a result from a measurement of an output signal output by the operational circuit, wherein the electronic device further comprises a sampling circuit that samples the output signal of the operational circuit at the frequency of the carrier signal, and the transfer characteristic measuring section measures the transfer characteristic of the operational circuit at the frequency of the additional signal based on the sampling result from the sampling circuit.

* * * * *